(12) United States Patent
Ellingboe

(10) Patent No.: US 6,204,607 B1
(45) Date of Patent: Mar. 20, 2001

(54) PLASMA SOURCE WITH MULTIPLE MAGNETIC FLUX SOURCES EACH HAVING A FERROMAGNETIC CORE

(75) Inventor: Albert R. Ellingboe, Fremont, CA (US)

(73) Assignee: Applied Komatsu Technology, Inc., Tokyo (JP)

( * ) Notice: Subject to any disclaimer, the term of this patent is extended or adjusted under 35 U.S.C. 154(b) by 0 days.

(21) Appl. No.: 09/086,778

(22) Filed: May 28, 1998

(51) Int. Cl.[7] ................................................. H05H 1/46
(52) U.S. Cl. .................................. 315/111.51; 118/723 I
(58) Field of Search ..................... 315/111.21, 111.41, 315/111.51; 156/345 C; 118/723 AN, 723 I, 723 IR

(56) References Cited

U.S. PATENT DOCUMENTS

| | | | |
|---|---|---|---|
| 4,947,085 | 8/1990 | Nakanishi et al. | 315/111.41 |
| 4,948,458 | 8/1990 | Ogle | 156/643 |
| 5,122,251 | 6/1992 | Campbell et al. | 204/298.06 |
| 5,198,725 | 3/1993 | Chen et al. | 315/111.41 |
| 5,261,962 | 11/1993 | Hamamoto et al. | 118/723 |
| 5,277,751 | 1/1994 | Ogle | 156/345 X |
| 5,435,881 | 7/1995 | Ogle | 156/345 |
| 5,464,476 | * 11/1995 | Gibb et al. | 156/345 C X |
| 5,589,737 | 12/1996 | Barnes et al. | 315/111.21 |
| 5,683,548 | * 11/1997 | Hartig et al. | 156/345 C X |
| 5,795,429 | * 8/1998 | Ishii et al. | 156/345 |
| 5,907,221 | * 5/1999 | Sato et al. | 315/111.51 |
| 5,998,933 | * 12/1999 | Shun'ko | 315/111.51 |

* cited by examiner

Primary Examiner—Justin P. Bettendorf
(74) Attorney, Agent, or Firm—Fish & Richardson

(57) ABSTRACT

Apparatus and methods for producing a plasma in a plasma chamber are described. One embodiment includes two or more sources of magnetic flux, each of which defines a single magnetic pole adjacent to a plasma chamber window. Each magnetic flux source is laterally spaced apart from any other magnetic flux source so that, during operation of the plasma source, plasma generation in regions of the plasma chamber immediately adjacent to the magnetic flux sources is substantially greater than plasma generation in regions of the plasma chamber located between the two or more sources. Another embodiment includes an antenna positioned adjacent to the plasma chamber window, and a ferromagnetic core positioned adjacent to the antenna. The ferromagnetic core is configured to concentrate magnetic flux in the vicinity of the antenna through the plasma chamber window and into the plasma chamber. The antenna and the ferromagnetic core are cooperatively configured to induce in the plasma chamber plasma currents that flow in planes that are substantially parallel to the plasma chamber window.

16 Claims, 9 Drawing Sheets

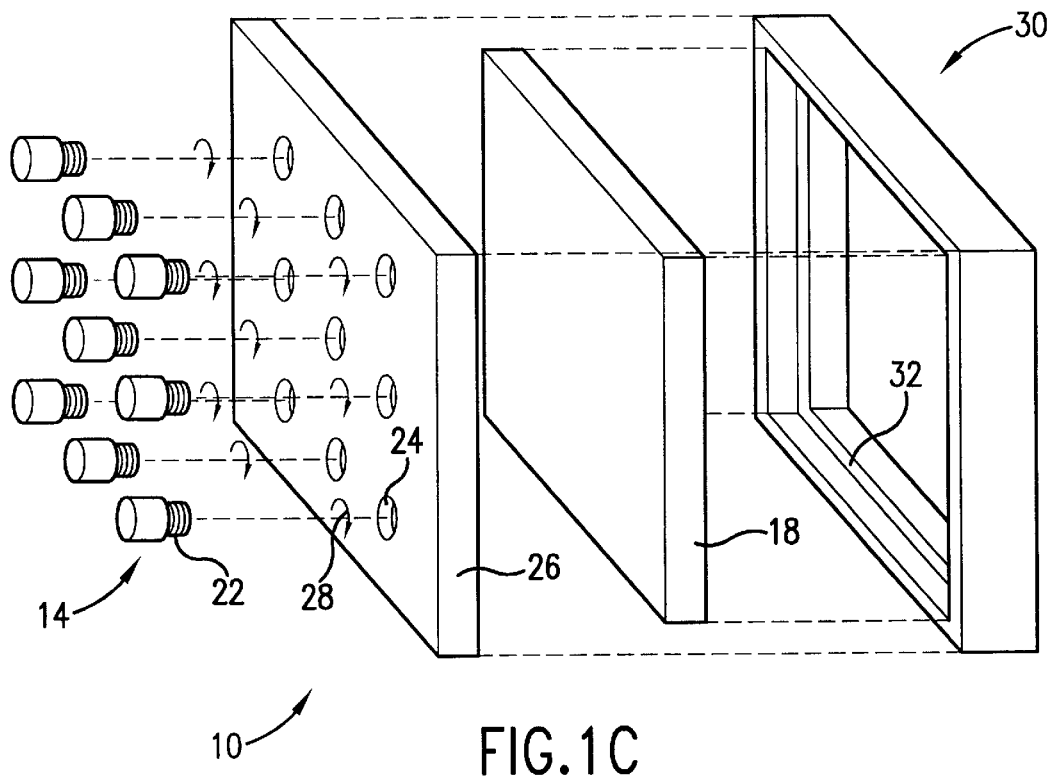
FIG.1C
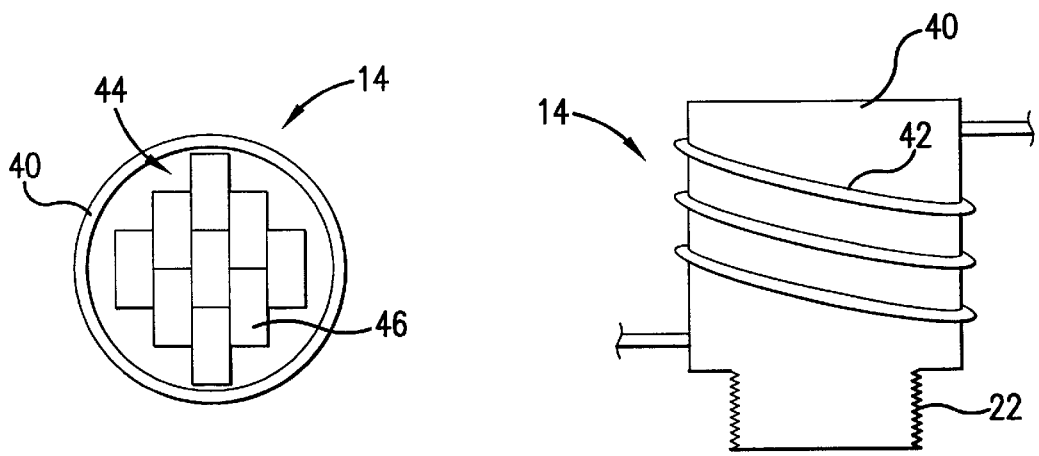
FIG.3B
FIG.3A

US 6,204,607 B1

PLASMA SOURCE WITH MULTIPLE MAGNETIC FLUX SOURCES EACH HAVING A FERROMAGNETIC CORE

TECHNICAL FIELD

This invention relates to apparatus and methods for producing a plasma useful for treating a substrate surface.

BACKGROUND

Plasmas are useful in a variety of device fabrication processes, including etching, deposition, surface cleaning, and ion implantation. Plasmas may be produced by exciting free electrons in a gas to energy levels that are at or above the ionization energy of the gas molecules. The free electrons may be excited by time-varying electric fields, time-varying magnetic fields, or both. In one approach, described in U.S. Pat. No. 5,435,881, a plasma is produced using a two-by-two or larger array of alternating magnetic poles set proximate to an insulating window in a chamber containing a process gas. The magnetic poles are ferromagnetic core coils driven by a radio-frequency power source. The magnetic poles are uniformly spaced from each other and are configured so that adjacent poles have the same magnitude but opposite magnetic polarity. In operation, the varying magnetic fields between adjacent, opposite polarity poles excite free electrons in the chamber to produce a plasma in the regions of the chamber located between adjacent poles.

SUMMARY

In one aspect, the invention features a plasma source comprising a plasma chamber adapted to receive a gas and having a window transmissive of magnetic flux, and two or more sources of magnetic flux. Each magnetic flux source defines a single magnetic pole adjacent to a plasma chamber window. Each magnetic flux source is laterally spaced apart from any other magnetic flux source so that during operation of the plasma source plasma generation in regions of the plasma chamber immediately adjacent to the magnetic flux sources is substantially greater than plasma generation in regions of the plasma chamber located between the two or more sources.

Each magnetic flux source preferably comprises an antenna for producing magnetic flux in the plasma chamber.

In another aspect, the invention features a plasma source comprising a plasma chamber adapted to receive a gas and having a generally planar window transmissive of magnetic flux, an antenna positioned adjacent to the plasma chamber window, and a ferromagnetic core positioned adjacent to the antenna and configured to concentrate magnetic flux in the vicinity of the antenna through the plasma chamber window and into the plasma chamber. The antenna and the ferromagnetic core are cooperatively configured to induce in the plasma chamber plasma currents that flow in planes that are substantially parallel to the plasma chamber window.

Embodiments may include one or more of the following features.

Each antenna may comprise an electrically conductive coil. Each electrically conductive coil may be generally cylindrical in shape and may define an axis normal to a plasma chamber window. Each electrically conductive coil may be substantially planar in shape; alternatively, each electrically conductive coil may be constructed to conform to a generally hemispherical surface. Each antenna may also comprise an electrically conductive, generally linear wire.

Each magnetic flux source preferably comprises a ferromagnetic (e.g., a ferrite) core. Each magnetic flux source may comprise a ferromagnetic core formed from a plurality of individual ferromagnetic units loaded in a generally cylindrical container. The plasma source may have a plurality of magnetic flux sources arranged in a generally planar array wherein the lateral spacing between neighboring magnetic flux sources is roughly the same.

In another aspect, the invention features a method of exciting a plasma in a plasma chamber containing a gas and having a window transmissive of magnetic flux. The method comprises introducing a gas into the plasma chamber, and applying radio-frequency energy to two or more laterally spaced apart antennas positioned adjacent to the plasma chamber window to induce in regions of the plasma chamber immediately adjacent to the antenna locations plasma generation that is substantially greater than plasma generation in regions of the plasma chamber located between the two or more antennas.

In yet another aspect, the invention features a method of exciting a plasma in a plasma chamber containing a gas and having a window transmissive of magnetic flux. The method comprises introducing a gas into the plasma chamber, and applying radio-frequency energy to an antenna having a ferromagnetic core positioned adjacent to the plasma chamber window to induce in the plasma chamber plasma currents that flow in planes that are substantially parallel to the plasma chamber window.

Among the advantages of the invention ire the following. Because magnetic coupling between the sources of magnetic flux is not required, each source of magnetic flux may be spaced apart from each other and may be powered independently of the other flux sources. This feature reduces the number of magnetic flux sources needed for a given plasma application. This feature also reduces the complexity of the circuit needed to drive the plasma source by greatly simplifying such design considerations as power distribution and power matching. The reduced number of magnetic flux sources also reduces the material cost, as well as the size and weight, of the plasma apparatus. Furthermore, the region of plasma generation inside the plasma chamber may be increased easily by providing additional magnetic flux sources in an array. The ferromagnetic cores enable the invention to produce a plasma with lower coil current levels, reducing the magnitude of parasitic losses in the circuitry that powers the plasma source.

The details of one or more embodiments of the invention are set forth in the accompanying drawings and the description below. Other features, objects, and advantages of the invention will be apparent from the description and drawings, and from the claims.

DESCRIPTION OF DRAWINGS

FIGS. 1B and 1C are top and exploded views of the plasma apparatus of FIG. 1A, respectively.

FIGS. 3A and 3B are, respectively a side view and a top view of a source of magnetic flux, respectively.

Like reference numbers and designations in the various drawings indicate like elements.

DETAILED DESCRIPTION

Figure 1A:
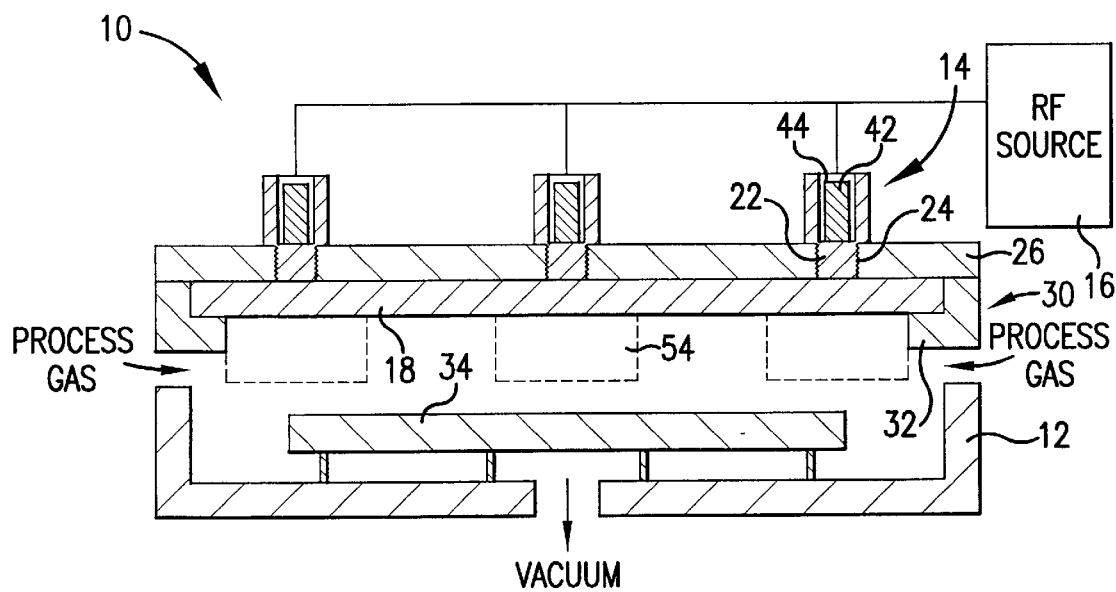
FIG. 1A is a cross-sectional view of an apparatus for producing a plasma, including a plasma chamber and a plurality of sources of magnetic flux.
Figure 1B:
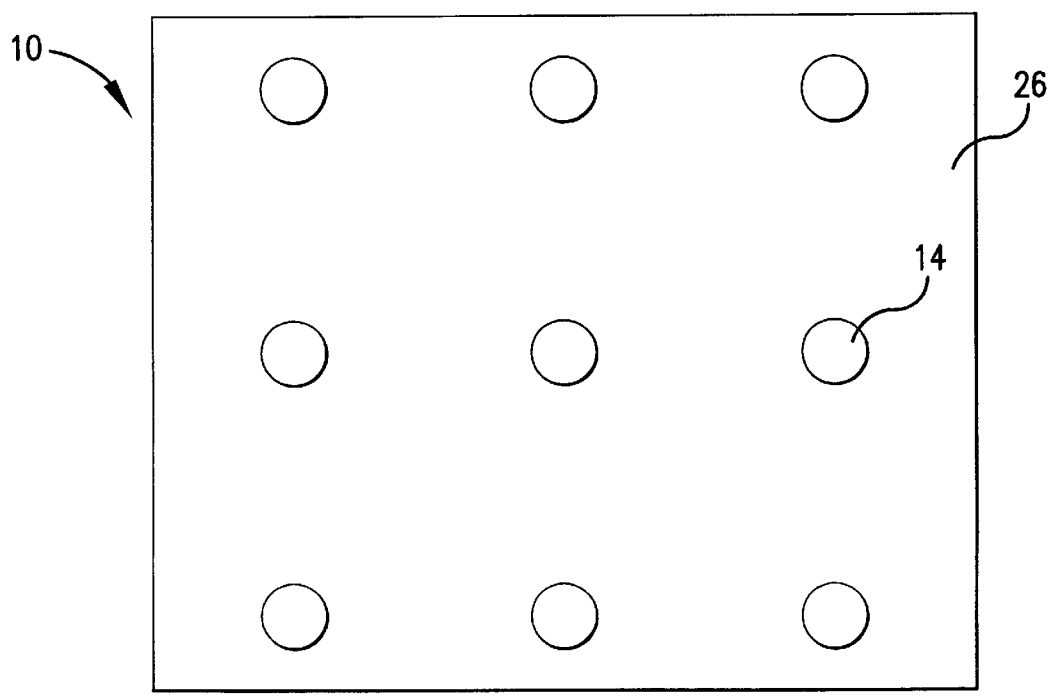

Referring to FIGS. 1A–1C, an apparatus 10 for producing a plasma includes a plasma chamber 12 and a plurality of magnetic flux sources 14, each of which is coupled to receive radio-frequency (RF) energy from an RF source 16 and independently deliver time-varying magnetic fields through a generally planar window 18 and into plasma chamber 12. Magnetic flux sources 14 have threaded ends 22 that screw into mating receptacles 24 of a mounting plate 26, as indicated by arrows 28 (FIG. 1C). A support plate 30 includes a flange 32 for supporting window 18. Mounting plate 26 couples to support plate 30 and thereby retains window 18 in place. As shown in FIGS. 1B and 1C, magnetic flux sources 14 are uniformly distributed across the top of apparatus 10 and are evenly spaced apart from each other so as to produce a uniform plasma at the surface of a substrate 34 to be processed inside plasma chamber 12. One or more sources of magnetic flux 14 may be used to produce a plasma inside chamber 12. The region of plasma chamber 12 in which plasma is generated may be increased by including additional sources 14 in an array. As explained below, each magnetic flux source 14 acts independently of the others; this greatly simplifies power distribution and power matching considerations.

In operation, a vacuum pump reduces the pressure inside plasma chamber 12 to a sub-atmospheric level (e.g., 0.1–100 mTorr), and a gas is introduced into plasma chamber 12. The time-varying magnetic fields produced by magnetic flux sources 14 excite free electrons in the gas to produce a plasma of ionized gas molecules and roughly an equal number of electrons. The induced plasma currents are localized in regions 54 immediately adjacent to sources 14 and flow in planes which are generally parallel to window 18. The resulting plasma may be used to treat substrate 34, e.g., by etching the substrate surface, cleaning the substrate surface, or depositing films onto the substrate surface.

Figure 2A:
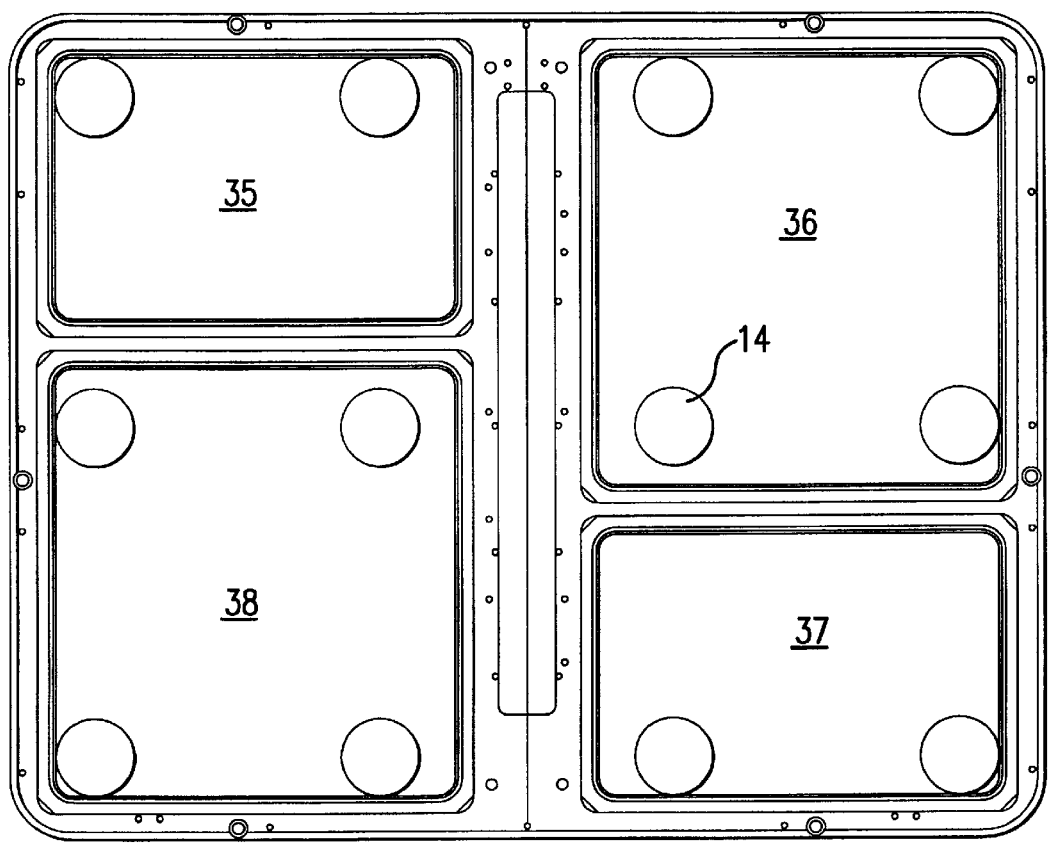
FIGS. 2A and 2B are, respectively, a top view and a side view of an alternative plasma chamber support plate and window assembly.
Figure 2B:
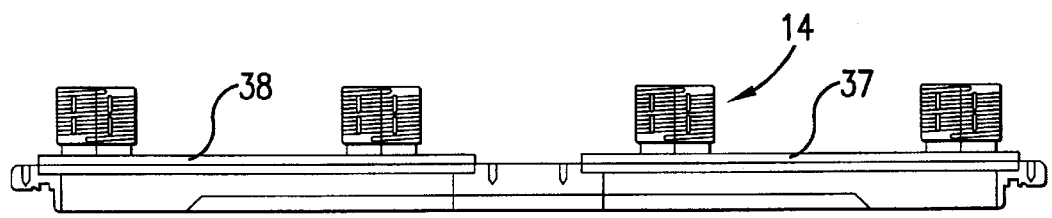

Window 18 is formed from a material that is transmissive of magnetic flux and is preferably formed from quartz, ceramic or other insulating material. Magnetic flux sources 14 may be separated from the reduced pressure inside of plasma chamber 12 by a single window 18, as shown in FIG. 1A. Alternatively, two or more individually supported windows 35–38 may be used to separate magnetic flux sources 14 from the reduced pressure inside of plasma chamber 12, as shown in FIGS. 2A and 2B. For descriptions of other multi-window plasma chambers see, for example, Hamamoto, U.S. Pat. No. 5,261,962, and Ogle, U.S. Pat. No. 5,435,881. Mounting plate 26 is preferably formed from a material that is transmissive of magnetic flux (e.g., a plastic such as polytetrafluoroethylene (PTFE)—TEFLON® brand fluoropolymer resin available from DuPont).

Figure 3C:
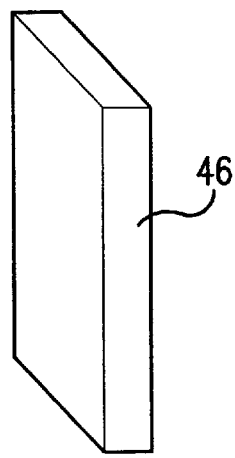
FIG. 3C is a diagrammatic view of an individual unit of ferromagnetic material.

Referring to FIGS. 3A and 3B, each magnetic flux source 14 includes a container 40 formed from, e.g., a plastic such as polytetrafluoroethylene (PTFE) (TEFLON® brand fluoropolymer resin available from DuPont), and an antenna formed from a coil 42 of electrically conductive material (e.g., copper wire). The number of turns in coil 42 will depend on the coil diameter and the desired inductance; two to five turns may be used for a coil diameter of about 5 cm (about 2 inches), an inductance in the range of 1–5 $\mu$H. Coil 42 will generally have a current-carrying capacity in the range of 1–20 amps. Each container 40 contains a core 44 formed from ferromagnetic material (e.g., powdered iron or ferrite). As shown in FIGS. 3B and 3C, core 44 may be formed from a plurality of individual ferrite units 46 that are stackable inside container 40, which, as shown, may be cylindrical in shape. This construction allows air to flow between the individual ferrite units and thereby assist in cooling the core during operation of plasma apparatus 10. In one embodiment, ferrite units 46 have a size of about 5 cm by about 3.7 cm by about 0.6 cm (about 2 inches by about 1.5 inches by about 0.25 inches).

Figure 4A:
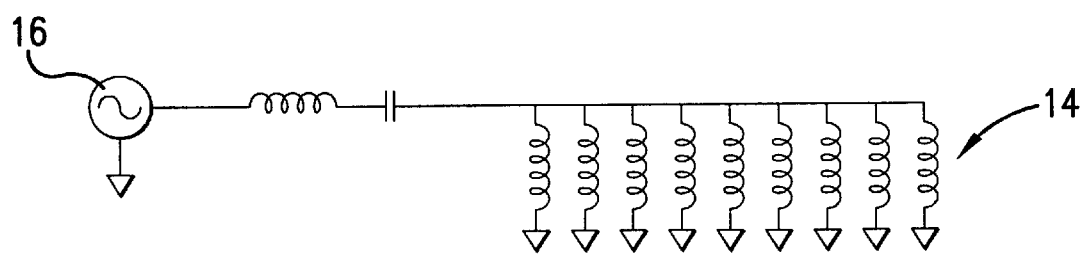
FIGS. 4A and 4B are diagrams of alternative circuits for supplying power to the plasma apparatus of FIG. 1A.
Figure 4B:
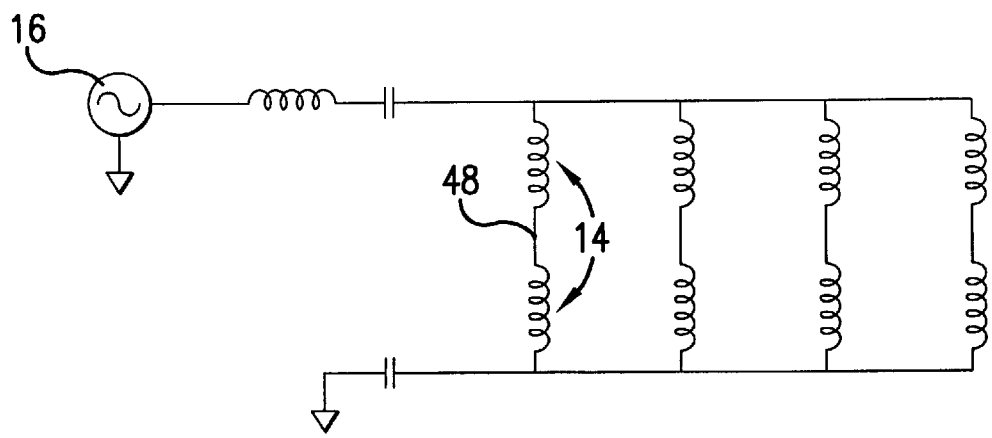

Magnetic flux sources 14 may be energized in many different ways. In order to reduce plasma etching of window 18, however, it is desirable to avoid the application of a substantial electric potential in the vicinity of window 18. In one embodiment, shown in FIG. 4A, nine magnetic flux sources 14 may be coupled in parallel to an RF source 16 that is configured to apply a time-varying RF voltage. The end of each coil that is nearest to window 18 is connected to ground potential so that conductors in the vicinity of window 18 remain near ground potential, which substantially reduces capacitive coupling with the plasma inside plasma chamber 12 and, thereby, substantially reduces plasma etching of window 18. In another embodiment, shown in FIG. 4B, eight magnetic flux sources 14 may be paired and each pair may be coupled to an RF source 16 that is configured to apply a time-varying RF voltage that alternates between positive and negative values relative to ground potential. In this embodiment, the coils of the magnetic flux sources of each pair are wound so that center points 48 are located closest to window 18 such that the vicinity of window 18 remains near ground potential. In each embodiment, RF source 16 will usually operate at a frequency in the range of about 1 MHZ to about 100 MHZ, and will preferably be operated at 13.56 MHZ. RF source 16 typically has an impedance of about 50 Ohms, and a currentproducing capacity of about 1–10 amps, with an RMS voltage of about 50–500 volts.

Figure 5:
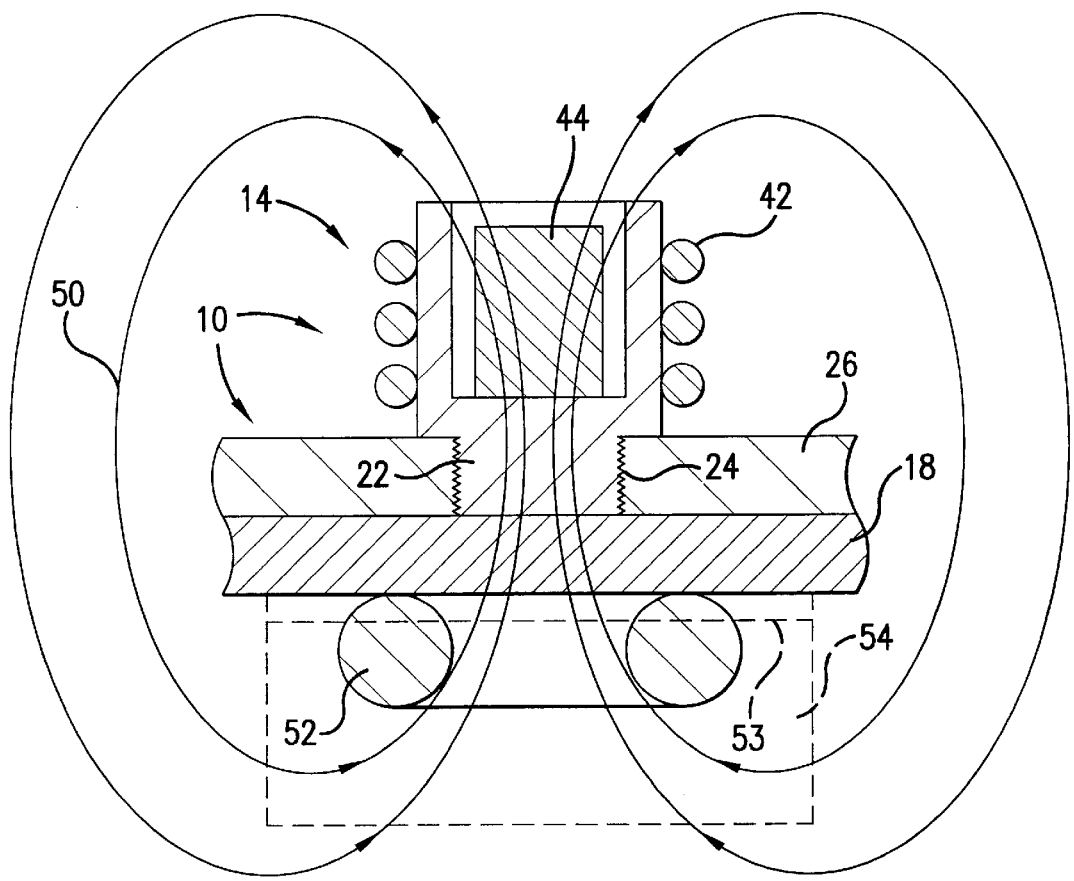
FIG. 5 is a cross-sectional view of a magnetic flux source exciting a plasma in the plasma chamber of FIG. 1A.

Referring to FIG. 5, during, operation of apparatus 10, RF currents in coil 42 induce fields 50 of magnetic flux through ferromagnetic core 44, window 18, and inside plasma chamber 12. The induced magnetic fields excite free electrons in the gas contained inside plasma chamber 12 to induce production of a generally torroidal plasma 52 formed from plasma currents which flow in planes 53 that are substantially parallel to plasma chamber window 18. Each magnetic flux source 14 is laterally spaced apart from each other so that there is insignificant coupling between magnetic flux sources 14 and, therefore, insignificant plasma production between magnetic flux sources 14 relative to the total plasma production inside chamber 12. The distance separating magnetic flux sources 14 is preferably approximately the same as the distance separating window 18 from the surface of the substrate to be processed. The preferred spacing between magnetic flux sources 14 will, however, typically depend upon the plasma process to be implemented inside chamber 12. For operating pressures in the range of about 1 mtorr to about 100 mToff, magnetic flux sources 14 are spaced apart by a distance in the range of about 10–46 cm (about 4–18 inches), and are preferably spaced apart by about 26.7 cm (about 10.5 inches). Accordingly, plasma generation in regions 54 of plasma chamber 12 immediately adjacent to magnetic flux sources 14 is substantially greater than plasma generation in other regions of the plasma chamber (see also FIG. 1A). Magnetic coupling between magnetic flux sources 14 is evidenced when the locus of plasma production appears in the regions of plasma chamber 12 located between magnetic flux sources 14 (e.g., in the regions located between regions 54).

Because there is insignificant magnetic coupling between neighboring magnetic flux sources, each magnetic flux source may be powered by RF source 16 independently of the other magnetic flux sources. Magnetic flux sources 14 may therefore be powered so that the magnetic polarities of magnetic flux sources 14 are the same or different at any given time. This provides added flexibility in selecting various design features of apparatus 10, and reduces the complexity of the circuit needed to drive magnetic flux sources 14.

Figure 6B:
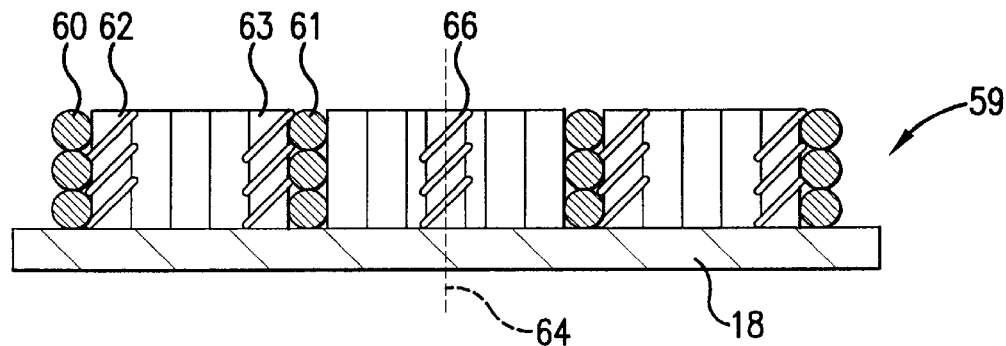
FIGS. 6A and 6B are, respectively, a top view and a cross-sectional side view of two concentric, planar antennas and respective ferromagnetic cores positioned adjacent to a plasma chamber window.
Figure 6A:
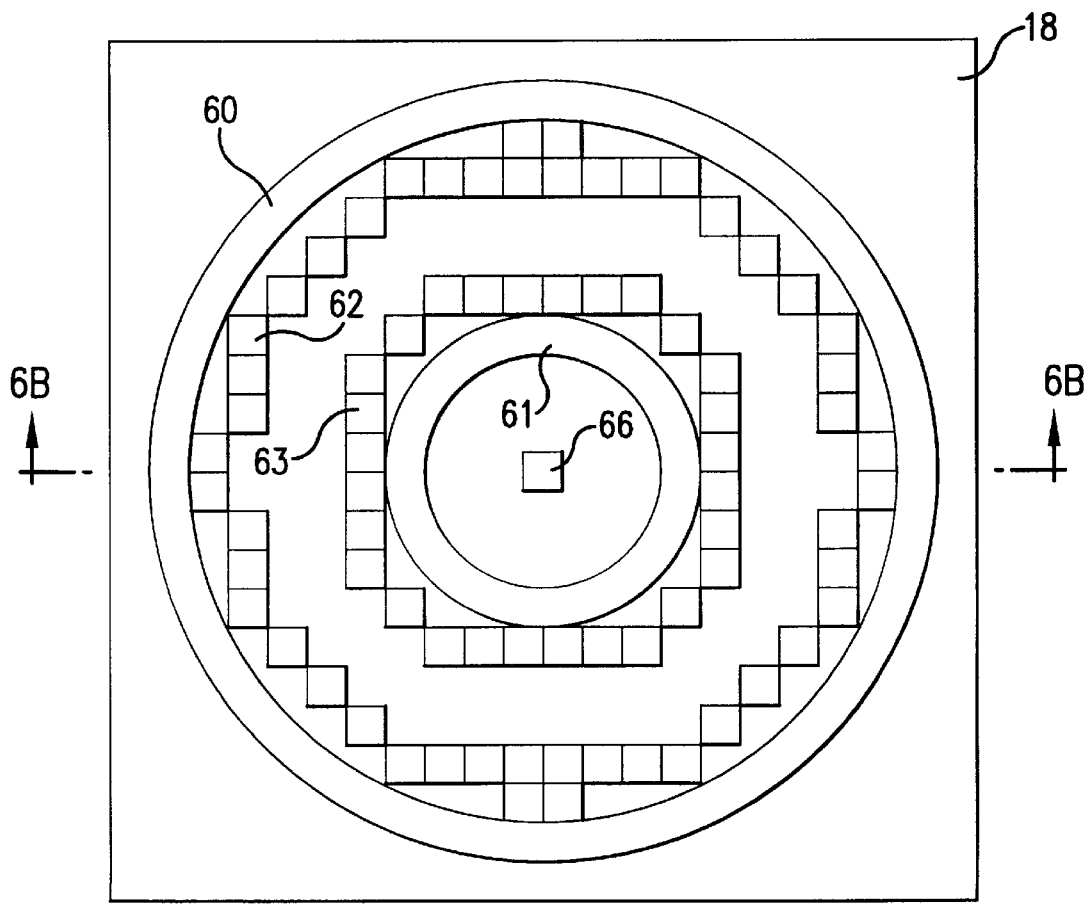

Referring to FIGS. 6A and 6B, in another plasma apparatus 59, magnetic flux may be induced inside a plasma chamber by antennas 60, 61 and ferromagnetic cores 62, 63 which are positioned adjacent to plasma chamber window 18. Antennas 60, 61 are formed from electrically conductive coils that are generally cylindrical in shape and define a common axis 64 which is substantially normal to plasma chamber window 18. Ferromagnetic cores 62, 63 are formed from a plurality of individual ferrite units that are disposed across the surface of window 18 adjacent to antennas 60, 61. An additional ferromagnetic core 66 is positioned on window 18 at the location of axis 64. Antennas 60, 61 and ferromagnetic cores 62, 63 and 66 are cooperatively configured to induce plasma currents inside a plasma chamber that flow in planes that are substantially parallel to plasma chamber window 18. Antennas 60, 61 and cores 62, 63 and 66 may be sized to produce a generally uniform plasma at the surface of the substrate to be processed. Antennas 60, 61 may be laterally spaced apart so that there is insignificant plasma production between them, as described above; in this case, antennas 60, 61 may be powered independently of each other. Alternatively, antennas 60, 61 may be spaced apart by a distance selected to produce a plasma in the regions of plasma chamber 12 located between antennas 60, 61.

Figure 7B:
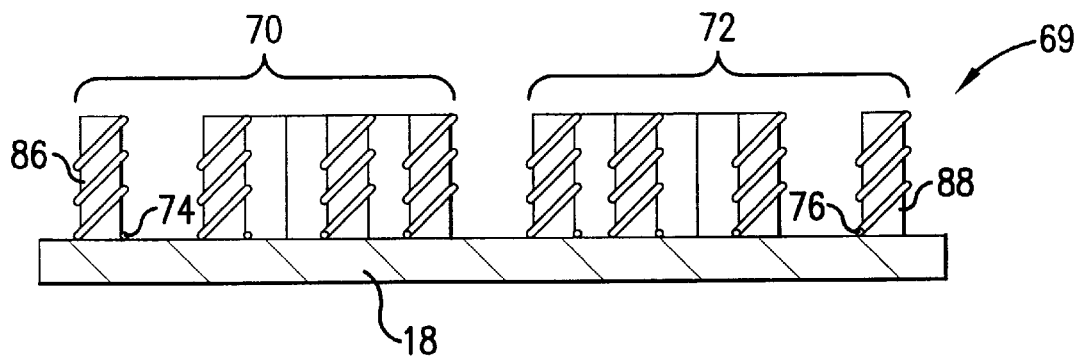
FIGS. 7A and 7B are, respectively, a top view and a cross-sectional side view of two side-by-side planar antennas and respective ferromagnetic cores positioned adjacent to a plasma chamber window.
Figure 7A:
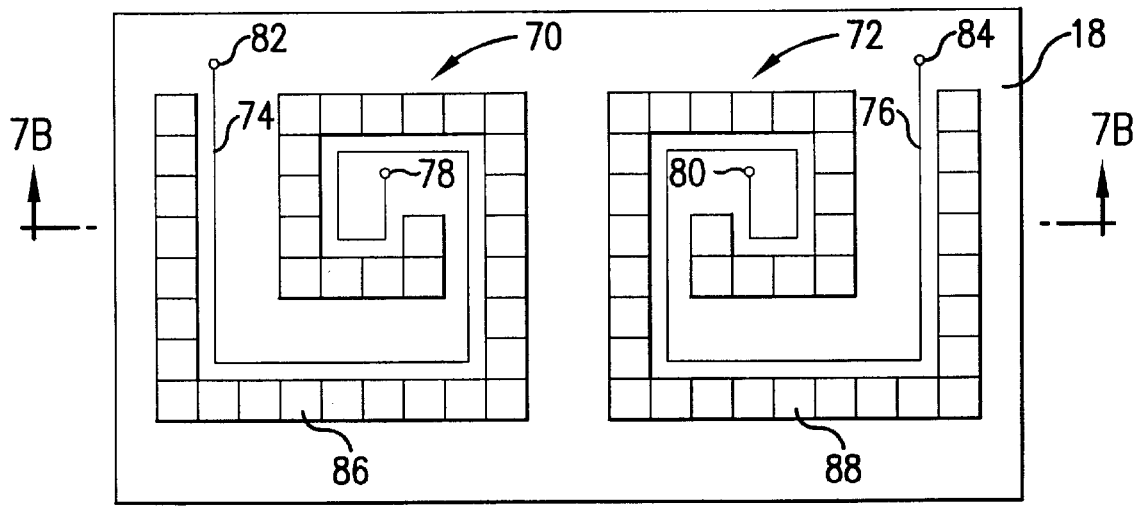

Referring to FIGS. 7A and 7B, in another plasma apparatus 69, two (or more) antennas 70, 72 may be used to produce a generally uniform plasma at the surface of a substrate to be processed. Antennas 70, 72 are formed from respective planar spiral coils 74, 76, each of which has a center tap 78, 80 and an outer tap 82, 84 for coupling to an RF power source. Antennas 70, 72 may be laterally spaced apart so that there is insignificant plasma production between them, as described above; in this case, antennas 70, 72 may be powered independently of each other. Alternatively, antennas 70, 72 may be spaced apart by a distance selected to produce a plasma in the regions of plasma chamber 12 located between antennas 70, 72. Ferromagnetic cores 86, 88, which are formed from a plurality of individual ferromagnetic units (e.g., powdered iron or ferrite), are disposed adjacent to the spiral coils 74, 76. Antennas 70, 72 and ferromagnetic cores 86, 88 are cooperatively configured to induce inside a plasma chamber plasma currents that flow in planes that are substantially parallel to plasma chamber window 18.

Figure 8B:
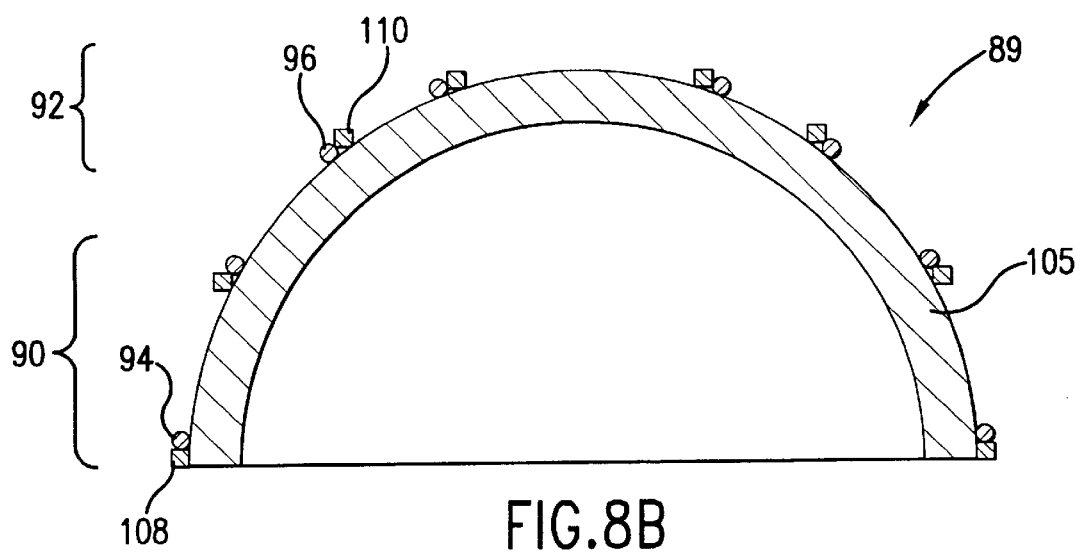
FIGS. 8A and 8B are, respectively, a top view and a cross-sectional side view of two concentric antennas and respective ferromagnetic cores positioned adjacent to a generally hemispherical plasma chamber window.
Figure 8A:
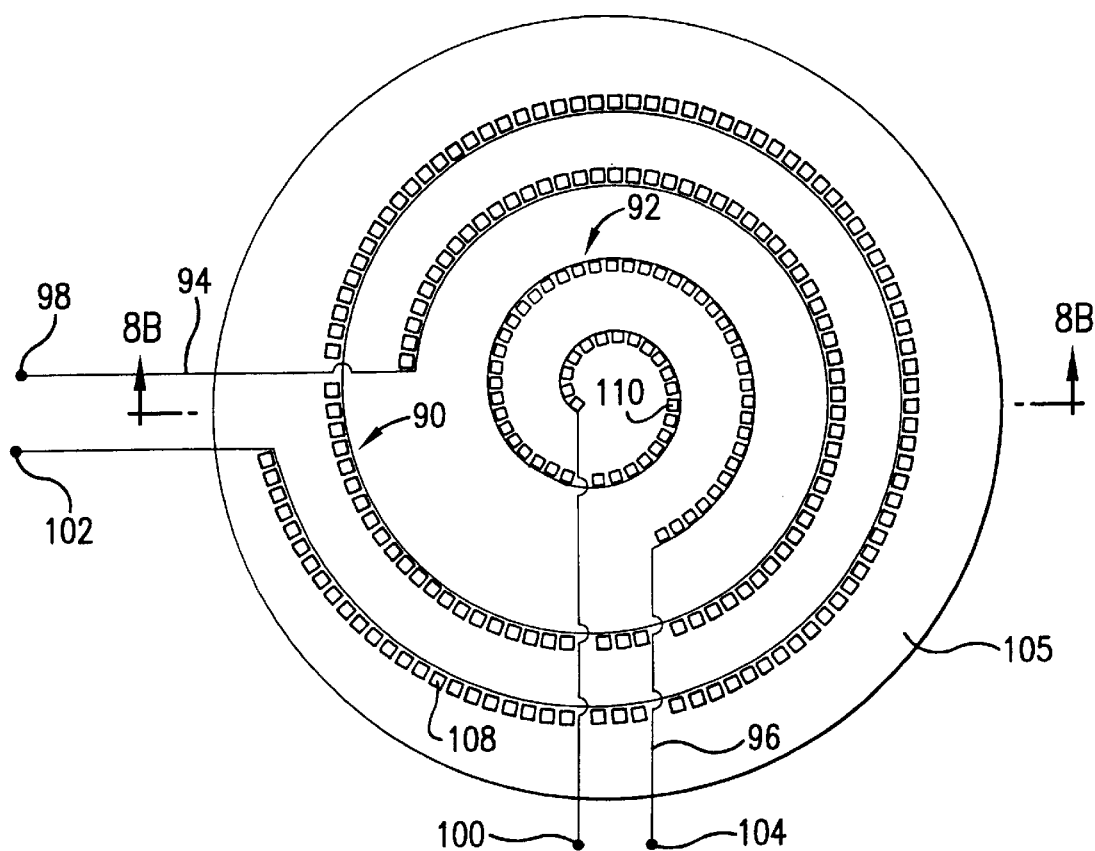

Referring to FIGS. 8A and 8B, in another embodiment of a plasma apparatus 89, antennas 90, 92 may be formed from two concentric coils 94, 96, each of which has a center tap 98, 100 and an outer tap 102, 104 for coupling to an RF power source. Coils 94, 96 are constructed to conform to the generally hemispherical outer surface of a plasma chamber window 105. Antennas 90, 92 may be laterally spaced apart so that there is insignificant plasma production between them, as described above; in this case, antennas 90, 92 may be powered independently of each other. Alternatively, antennas 90, 92 may be spaced to so that plasma is produced inside plasma chamber 12 in the regions located between antennas 90, 92. Ferromagnetic cores 108, 110 each consists of a series of individual ferromagnetic units (e.g., powdered iron or ferrite) disposed adjacent to coils 94, 96, respectively. Antennas 90, 92 and ferromagnetic cores 108, 110 are cooperatively configured to induce inside a plasma chamber plasma currents that flow in planes that are substantially parallel to planes that are tangent to the outer surface of plasma chamber window 105.

The embodiments of FIGS. 6A–8B may be powered by RF source 16 in ways that are similar to the powering schemes described above in connection with the embodiment of FIG. 1A. Also, in each of the embodiments described above, instead of being formed from a plurality of individual ferromagnetic units, the ferromagnetic cores may consist of a single ferromagnetic unit that has been processed to have the desired shape.

Figure 9:
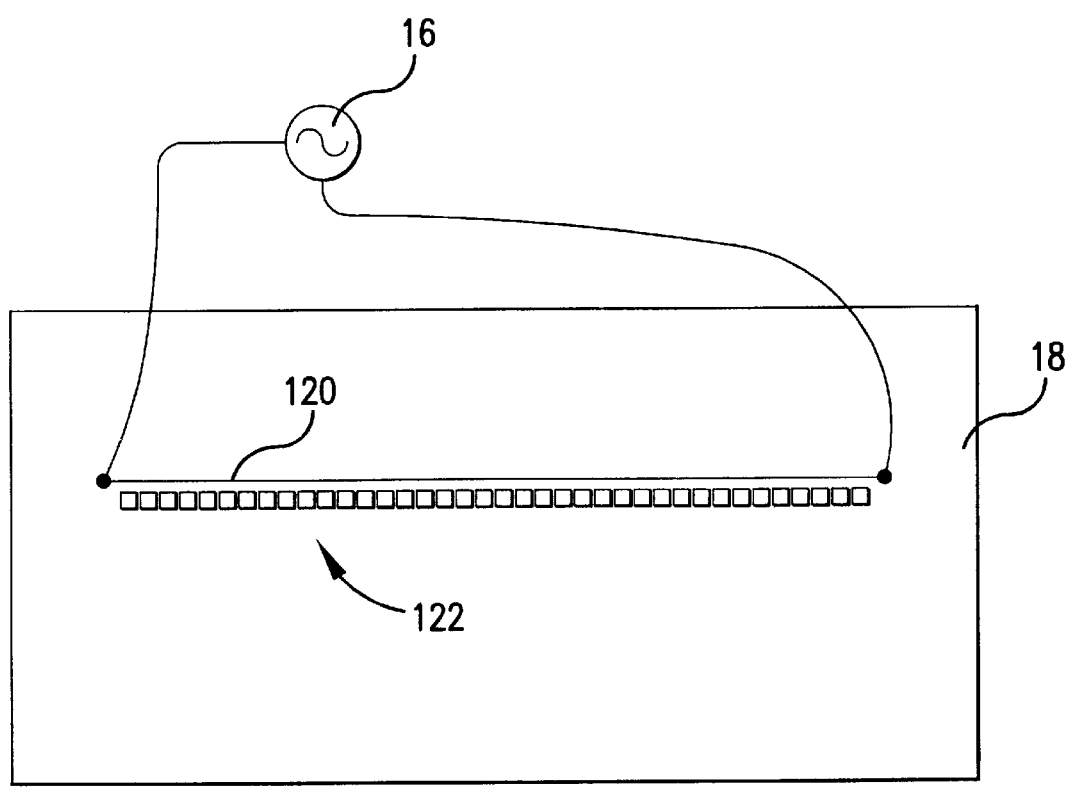
FIG. 9 is a diagrammatic top view of a linear antenna and a ferromagnetic core positioned adjacent to a plasma chamber window.

A number of embodiments of the present invention have been described. Neverthe-less, it will be understood that various modifications may be made without departing from the spirit and scope of the invention. For example, as shown in FIG. 9, an antenna 120 may be formed from one (or more) electrically conductive, generally linear wire positioned adjacent to plasma chamber window 18. In this embodiment, ferromagnetic core 122, which consists of a plurality of individual ferromagnetic units, is disposed on window 18 adjacent to antenna 120.

Accordingly, other embodiments are within the scope of the following claims.

What is claimed is:

1. A plasma source comprising:
   a plasma chamber adapted to receive a gas and having a window transmissive of magnetic flux; and
   two or more sources of magnetic flux, each magnetic flux source defining a single magnetic pole adjacent to a plasma chamber window, each magnetic flux source being laterally spaced apart from any other magnetic flux source so that during operation of the plasma source plasma generation in regions of the plasma chamber immediately adjacent to the magnetic flux sources is substantially greater than plasma generation in regions of the plasma chamber located between the two or more sources,
   wherein each magnetic flux source comprises a ferromagnetic core.

2. The plasma source of claim 1 wherein each magnetic flux source comprises an antenna for producing magnetic flux in the plasma chamber.

3. The plasma source of claim 2 wherein each antenna comprises an electrically conductive coil.

4. The plasma source of claim 3 wherein each electrically conductive coil is generally cylindrical in shape and defines an axis normal to a plasma chamber window.

5. The plasma source of claim 3 wherein each electrically conductive coil is substantially planar in shape.

6. The plasma source of claim 3 wherein each electrically conductive coil is constructed to conform to a generally hemispherical surface.

7. The plasma source of claim 1 having a plurality of magnetic flux sources arranged in a generally planar array wherein the lateral spacing between neighboring magnetic flux sources is roughly the same.

8. A method of exciting a plasma in a plasma chamber containing a gas and having a window transmissive of magnetic flux, comprising;

introducing a gas into the plasma chamber; and applying radio-frequency energy to two or more laterally spaced apart antennas, said two or more laterally spaced apart antennas are uniformly distributed and evenly spaced from one another and positioned to induce in regions of the plasma chamber immediately adjacent to the antenna locations plasma generation that is substantially greater than plasma generation in regions of the plasma chamber located between the two or more antennas; and said two or more antennas each comprising a ferromagnetic core.

9. A method of exciting a plasma in a plasma chamber containing a gas and having a window transmissive of magnetic flux, comprising;

introducing a gas into the plasma chamber; and applying radio-frequency energy to an antenna having a ferromagnetic core positioned adjacent to the plasma chamber window, the antenna and the ferromagnetic core being cooperatively configured to substantially follow each other, thus comprising coinciding shape and configuration to one another to induce in the plasma chamber plasma currents that flow in planes that are substantially parallel to the plasma chamber window.

10. A plasma source comprising:

a plasma chamber adapted to receive a gas and having a window transmissive of magnetic flux; and two or more sources of magnetic flux, each magnetic flux source defining a single magnetic pole adjacent to a plasma chamber window, each magnetic flux source being laterally spaced apart from any other magnetic flux source so that during operation of the plasma source plasma generation in regions of the plasma chamber immediately adjacent to the magnetic flux sources is substantially greater than plasma generation in regions of the plasma chamber located between the two or more sources, wherein each magnetic flux source comprises a ferrite core formed from a plurality of individual ferromagnetic units loaded in a generally cylindrical container.

11. A plasma source comprising:

a plasma chamber adapted to receive a gas and having a window transmissive of magnetic flux; and an antenna positioned adjacent to the plasma chamber window; and a ferromagnetic core positioned adjacent to the antenna and configured to concentrate magnetic flux in the vicinity of the antenna through the plasma chamber window and into the plasma chamber;

the antenna and the ferromagnetic core being cooperatively configured to substantially follow each other, thus comprising coinciding shape and configuration to induce in the plasma chamber plasma currents that flow in planes that are substantially parallel to the plasma chamber window.

12. The plasma source of claim 11 wherein the antenna comprises an electrically conductive coil.

13. The plasma source of claim 12 wherein the electrically conductive coil is generally cylindrical in shape and defines an axis normal to a plasma chamber window.

14. The plasma source of claim 12 wherein the electrically conductive coil is substantially planar in shape.

15. The plasma source of claim 12 wherein the electrically conductive coil is generally hemispherical in shape.

16. The plasma source of claim 11 wherein the antenna comprises an electrically conductive, generally linear wire.

* * * * *